United States Patent [19]

Mahvan et al.

[11] Patent Number: 5,482,785
[45] Date of Patent: Jan. 9, 1996

[54] MAGNETIC RECORDING MEDIUM HAVING AN INTERMEDIATE LAYER COMPRISING UNIFORM SIZE GLOBULES OF AG SN PERITECTIC ALLOY

[75] Inventors: Nader Mahvan; Atef H. Eltoukhy, both of Santa Clara; Edward Teng, Sunnyvale; Hung-Chang W. Huang, San Jose, all of Calif.

[73] Assignee: StorMedia, Inc., Santa Clara, Calif.

[21] Appl. No.: 346,474

[22] Filed: Nov. 29, 1994

Related U.S. Application Data

[62] Division of Ser. No. 959,986, Oct. 13, 1992.
[51] Int. Cl.$^6$ ..................................... G11B 5/00
[52] U.S. Cl. .............. 428/611; 428/141; 428/336; 428/408; 428/457; 428/612; 428/614; 428/621; 428/656; 428/663; 428/667; 428/669; 428/673; 428/694 TS; 428/694 TR; 428/694 TC; 428/900; 428/928
[58] Field of Search ..................... 428/141, 336, 428/408, 457, 663, 611, 656, 667, 669, 673, 694 TS, 694 TR, 694 TC, 900, 928, 612, 614, 621; 420/501

[56] References Cited

U.S. PATENT DOCUMENTS

| | | | |
|---|---|---|---|
| 4,539,265 | 9/1985 | Yazawa | 428/621 |
| 5,134,038 | 7/1992 | Buseman et al. | 428/611 |

OTHER PUBLICATIONS

Khandros, R. *J. Vac. Sci. Technol A 7 (3) May 1989* pp. 1334–1340 "Thin Film Topography Control with Transient Liquid Underlayer".

Primary Examiner—Stevan A. Resan

[57] ABSTRACT

Thin film media characterized by the utilization of a substantially peritectic seed alloy layer which is sputter deposited so as to provide dispersed, substantially peritectic and homogenous globules underlying subsequently deposited media layers. These media layers may include a metal layer such as chrome and a magnetic layer such as an alloy of cobalt, chromium, and platinum and possibly other ingredients.

4 Claims, 5 Drawing Sheets

MAGNETIC RECORDING MEDIUM HAVING AN INTERMEDIATE LAYER COMPRISING UNIFORM SIZE GLOBULES OF AG SN PERITECTIC ALLOY

This is a division of application Ser. No. 959,986, filed Oct. 13, 1992.

GENERAL BACKGROUND OF INVENTION

This invention is directed to the attainment of enhanced uniformity in surface texturing and enhanced magnetic properties for thin film magnetic media.

These significant objectives are obtained through the unique utilization of substantially peritectic alloys, with these peritectic alloys being employed as a seed layer deposited as dispersed globules of a substantially homogenous and peritectic nature.

Heretofore, it has been recognized that, seed layers deposited by sputter deposition beneath magnetic media layers, may be deposited in form of islands or dispersed loci. Such is contemplated, for example, in United States Baseman et al U.S. Pat. No. 5,134,038, issued to International Business Machines Corporation on Jul. 28, 1992.

This patent proposes the utilization of a variety of island, or dispersed loci, forming seed layer materials including gallium, indium, tin, bismuth, lead, cadmium, mercury, selenium, tellerium and alloys of such metals with other metals including silver, palladium, platinum, gold, and binary and ternary compounds of the metals.

As described and presented in the Baseman et al disclosure, a seed layer of this nature comprises a "transient liquid metal" deposited underneath an intermediate metal film layer over which, in turn, a magnetic film layer is subsequently deposited. Baseman et al postulate that the intermediate film layer in this arrangement controls the reaction of the transient liquid metal comprising the seed layer and the magnetic film layer which may comprise cobalt, chromium, platinum, etc.

Other disclosures such as Yazawa U.S. Pat. No. 4,539,265 (Sony—Sep. 3, 1985) and Kawana et al European Patent Application 0 079 391 (Sony Corporation—Published May 25, 1983) disclose metals including bismuth and cobalt being operable to provide a dispersed loci or island configuration. However, it is to be noted that disclosures such as Kawana appear to contemplate that the roughness provided by the cobalt globules would be emasculated by the formation of a smooth exterior surface of the overdeposited magnetic layer.

While disclosures such as those above noted do address the possibility of forming a seed layer of an island-like or dispersed loci nature, there does not appear to be any recognition in the prior art of the unique advantages attendant upon the utilization of substantially peritectic alloys which are operable to provide an homogenous, dispersed globule type of seed layer which produces unique uniformity or homogeneity in surface texturing of the media and unique improvements in magnetics properties of the media including improved modulation and coercivity characteristics.

Moreover, these advantages are believed to be obtained without reliance upon the use of an intermediate metal film layer, which may comprise chromium, "to control a reaction between a transient seed layer and a magnetic film layer" as emphasized and disclosed in Baseman et al as being the characterizing and dominant aspect of this IBM proposal.

Having delineated what is understood to be the general state of the prior art and the basic thrust of the present invention, it is appropriate at this juncture to summarize various individually significant aspects of the invention.

SUMMARY OF THE INVENTION

A particularly advantageous method aspect of the invention, producing enhanced magnetic properties for thin film magnetic recording media, is characterized as follows:

A method for enhancing the magnetic properties of thin film magnetic recording media, this method comprising:
  providing a sputtering target comprising a substantially homogenous and peritectic alloy;
  forming a seed layer, comprising a substantially homogenous and peritectic alloy on a substrate, by sputter deposition from the substantially homogenous target;
  sputter coating a magnetic recording layer over the substantially peritectic alloy seed layer; and
  substantially maintaining the homogeneity of the alloy in its sputtering transition from the sputtering target to the substrate and while the magnetic recording layer is formed;
  the presence of the substantially homogenous and peritectic seed layer being operable
    to substantially orient the crystal orientation of said magnetic recording layer such that the axis of easy magnetization generally lies in the film plane of said media, and
    to substantially reduce the magnetic variation in the film plane of said magnetic, recording layer; and
  the thickness of the seed layer being controlled so as to be operable
    to substantially minimize modulation properties of the magnetic recording layer, and
    to substantially, nearly equalize coercivity of the magnetic recording layer as measured tangentially along the recording track and as measured orthogonally of the tangential measurement.

A further refined aspect of the magnetics improvement aspect of the invention, involving specifics of media layer composition and morphology, entails the following method concept:

A method as above described for enhancing the properties of thin film magnetic media wherein:
  the substantially peritectic alloy comprises
    about seventy five (75) percent, by weight, silver and about twenty five (25) percent, by weight, tin;
  the substantially peritectic alloy has a melting point as low as about four hundred eighty degrees centigrade (480° C.);
  a layer of chromium is formed by sputter deposition upon the seed layer;
  the magnetic recording layer, comprising cobalt, chromium, and platinum, is sputter deposited upon the chromium layer;
  a wear resistant layer comprising sputter deposited carbon is formed over the layer comprising cobalt, chromium, and platinum; and
  the substantially peritectic alloy is deposited as generally mutually spaced globules generally uniformly dispersed across an alloy receiving surface of the substrate, with
    the surface texturing of the media substantially mirroring the dispersion of the globules on said substrate and providing a generally uniform surface roughness.

Another independently significant method aspect of the invention pertaining to the attainment of enhanced surface texturing or roughness involves the following method:

A method for enhancing the textured properties of thin film magnetic recording media, this method comprising:

providing a sputtering target comprising a substantially homogenous and peritectic alloy;

forming a seed layer, comprising substantially uniformly sized but mutually dispersed globules of a substantially homogenous and peritectic alloy on a substrate, by sputter deposition from the substantially homogenous target;

sputter coating a magnetic recording layer over the substantially uniformly sized globules of the substantially peritectic alloy seed layer; and substantially maintaining the homogeneity of the alloy in its sputtering transition from said sputtering target to the substrate and while the magnetic recording layer is formed;

the presence of the substantially homogenous and peritectic seed layer being operable to provide the substantially uniform sizing of the dispersed globules of peritectic alloy, and consequently induce a substantially uniform surface roughness for the sputter coated magnetic recording layer.

This enhanced texturing method of the invention may be further refined by the specifics of media layer composition and morphology as above noted.

Not to be overlooked is a distinct and significant method aspect of the invention characterized by a seed layer comprising a substantially peritectic and homogenous alloy operable to enhance both magnetic and roughness properties of thin film magnetic recording media. This method aspect is characterized by the following composite concept:

A method for enhancing the magnetic and textured properties of thin film magnetic recording media, this method comprising:

providing a sputtering target comprising a substantially homogenous and peritectic alloy;

forming a seed layer, comprising substantially uniformly sized but mutually dispersed globules of a substantially homogenous and peritectic alloy on a substrate, by sputter deposition from the substantially homogenous target;

sputter coating a magnetic recording layer over the substantially uniformly sized globules of the substantially peritectic alloy seed layer; and substantially maintaining the homogeneity of the alloy in its sputtering transition from the sputtering target to the substrate and while the magnetic recording layer is formed;

the presence of the substantially homogenous and peritectic seed layer being operable to provide the substantially uniform sizing of the dispersed globules of peritectic alloy, to induce a substantially uniform surface roughness for the sputter coated magnetic recording layer, to substantially orient the crystal orientation of the magnetic recording layer such that the axis of easy magnetization generally lies in the film plane of the media, and to substantially reduce the magnetic variation in the film plane of the magnetic, recording layer; and the thickness of the seed layer being formed within a range of about fifty (50) to one hundred (100) angstrom, with the seed layer thickness being operable to substantially minimize modulation properties of the magnetic recording layer, and to substantially, nearly equalize coercivity of the magnetic recording layer as measured tangentially along the recording track and as measured orthogonally of the tangential measurement.

This composite method aspect of the invention may be further enhanced by the specifics of media layer composition and morphology noted above.

Turning now to apparatus aspects of the invention, it will be appreciated that these will separately and collectively involve apparatus combinations operable to implement each of the above noted method aspects of the invention.

Finally, the resulting consequences of method and apparatus aspects of the invention entail the production of enhanced magnetic thin film recording media.

A particularly advantageous media aspect of the invention, producing enhanced magnetics properties for thin film magnetic recording media, is characterized as follows:

Thin film magnetic recording media having enhanced magnetic properties, this media comprising:

substrate means;

a seed layer comprising a substantially homogenous and peritectic alloy formed on the substrate means, by sputter deposition from a substantially homogenous target; and a magnetic recording layer sputter coated over the substantially peritectic alloy seed layer, while substantially maintaining the homogeneity of the substantially peritectic alloy;

the presence of the substantially homogenous and peritectic seed layer being operable to substantially orient the crystal orientation of the magnetic recording layer such that the axis of easy magnetization generally lies in the film plane of said media, and to substantially reduce the magnetic variation in the film plane of the magnetic, recording layer; and the thickness of the seed layer being operable to substantially minimize modulation properties of the magnetic recording layer, and to substantially, nearly equalize coercivity of the magnetic recording layer as measured tangentially along the recording track and as measured orthogonally of the tangential measurement.

A further refined aspect of the invention, involving specifics of media layer composition and morphology, entails the following apparatus concept:

Thin film magnetic recording media having enhanced properties, wherein:

the substantially peritectic alloy comprises about seventy five (75) percent, by weight, silver and about twenty five (25) percent, by weight, tin;

the substantially peritectic alloy has a melting point as low as about four hundred eighty degrees centigrade (480° C.);

a layer of chromium is formed by sputter deposition upon the seed layer;

the magnetic recording layer, comprising cobalt, chromium, and platinum, is sputter deposited upon the chromium layer;

a wear resistant layer, comprising sputter deposited carbon., is formed over the layer comprising cobalt, chromium, and platinum; and the substantially peritectic alloy is deposited as generally mutually spaced, globules dispersed across an alloy receiving surface of the substrate means, with the surface texturing of the media substantially mirroring the surface dispersion of the globules on the substrate means and providing a generally uniform surface roughness.

A further media aspect of the invention relating to enhancement of roughness or surface texturing of media, involves media characterized as follows:

Thin film magnetic recording media having enhanced textured properties, this media comprising:
  substrate means;
  a seed layer, comprising substantially uniformly sized but mutually dispersed globules of a substantially homogenous and peritectic alloy, formed on the substrate means by sputter deposition from a substantially homogenous target; and
  a magnetic recording layer sputter coated over the substantially uniformly sized globules of the substantially peritectic alloy seed layer, while substantially maintaining the homogeneity of the substantially peritectic alloy;
  the presence of the substantially homogenous and peritectic seed layer being operable
    to provide the substantially uniform sizing of the dispersed globules of peritectic alloy, and
    consequentially induce a substantially uniform surface roughness for the sputter coated magnetic recording layer.

This enhanced surface textured media may be further refined by the media layer composition specifics and morphology noted above.

Of distinct and independent significance is a media aspect of the invention characterized by a seed layer comprising a substantially peritectic and homogenous alloy operable to enhance both magnetic and roughness properties of thin film magnetic recording media. This composite improvement media aspect is characterized by the following concept:

Thin film magnetic recording media having enhanced magnetic and textured properties, this media comprising:
  substrate means,
  a seed layer, comprising substantially uniformly sized but mutually dispersed globules of a substantially homogenous and peritectic alloy, formed on the substrate means by sputter deposition from the substantially homogenous target; and
  a magnetic recording layer sputter coated over the substantially uniformly sized globules of the substantially peritectic alloy seed layer, while substantially maintaining the homogeneity of the substantially peritectic alloy;
  the presence of the substantially homogenous and peritectic seed layer being operable
    to provide the substantially uniform sizing of the dispersed globules of peritectic alloy,
    to induce a substantially uniform surface roughness for the sputter coated magnetic recording layer,
    to substantially orient the crystal orientation of the magnetic recording layer such that the axis of easy magnetization generally lies in the film plane of the media, and
    to substantially reduce the magnetic variation in the film plane of the magnetic, recording layer; and
  the thickness of the seed layer being formed within a range of about fifty (50) to one hundred (100) angstrom, with the seed layer thickness being operable
    to substantially minimize modulation properties of the magnetic recording layer, and
    to substantially, nearly equalize coercivity of the magnetic recording layer as measured tangentially along the recording track and as measured orthogonally of said tangential measurement.

Of course, it will be here apparent that this composite improvement, media concept may be optimized by the inclusion of the following media characteristics:

Thin film magnetic recording media having enhanced properties, wherein:
  the substantially peritectic alloy comprises
    about seventy five (75) percent, by weight, silver and about twenty five (25) percent, by weight, tin;
  the substantially peritectic alloy has a melting point as low as about four hundred eighty degrees centigrade (480° C.);
  a layer of chromium is formed by sputter deposition upon the seed layer;
  the magnetic recording layer, comprising cobalt, chromium, and platinum, is sputter deposited upon the chromium layer;
  a wear resistant layer comprising sputter deposited carbon is formed over the layer comprising cobalt, chromium, and platinum; and
  the substantially peritectic alloy is deposited as generally mutually spaced, globules dispersed across an alloy receiving surface of the substrate means, with the surface texturing of the media substantially mirroring the surface dispersion of the globules on said substrate means and providing a generally uniform surface roughness.

Having summarized various individually significant aspects of the invention, it is appropriate at this juncture to delve into a discussion of presently preferred embodiments of the invention.

These presently preferred embodiments are described in the ensuing specification and in the appended drawings.

Having reviewed the manner in which the invention is presented in the illustrated drawings, it is now appropriate to consider a detailed description of presently preferred embodiments.

DETAILED DESCRIPTION OF PREFERRED EMBODIMENTS

In presenting the description of presently preferred embodiments, a technical overview of the invention will be presented, following which a detailed consideration of apparatus, method, and media aspects of the invention will be set forth.

Technical Overview

In this presentation, the effect of sputtering a thin layer of a peritectic silver/tin alloy (AG=74.5% by weight and SN=24.5% by weight) as a seed layer on glass and possibly other relatively non-wettable substrates is described. This particular composition of silver and tin (Ag—Sn) has a low enough melting point (~480° C.) to provide the familiar "ball-up" effect when applied on non-wettable substrates. Furthermore, it functions as a substantially peritectic alloy with resultant target and film homogeneity (i.e., substantially no phase separation takes place in forming the seed layer or depositing the magnetic recording layer).

A peritectic alloy of "x" and "y" metals comprises an alloy wherein, during equilibrium solidification, a solid x and liquid y react at the peritectic solidifcation temperature to yield a solid alloy "z" of uniform character. In other words, during solidifcation, instead of diverse and varied composition mixtures of "x" and "y" and some alloys thereof, a single, substantially homogenous alloy material "z" is produced.

It has been found that the deposition of a few tens of angstroms of such a peritectic metal alloy on these substrates will lead to the formation of media texture whose morphology and topology can be controlled by its thickness and the deposition temperature. In addition, the growth of the subsequent layers such as chromium (Cr) and a magnetic recording layer of a cobalt, chromium, platinum alloy (CoCrPt) is such that the easy recording of the recording alloy will lie markedly in the plane of the disc, often referred to as the thin film plane. This, together with the enhanced grain size and segregating, is thought to be the main mechanism of the observed improvement in the coercivity, coercivity squareness and recording parametrics. Furthermore, by influencing the shape and morphology of the Cr layer, the peritectic alloy seed layer provides an increase in the orientation ratio (the coercivity ratio between the travel direction (0) of the media and that ninety degrees to it (90)), resulting in a significant reduction in modulation.

Figure 3:
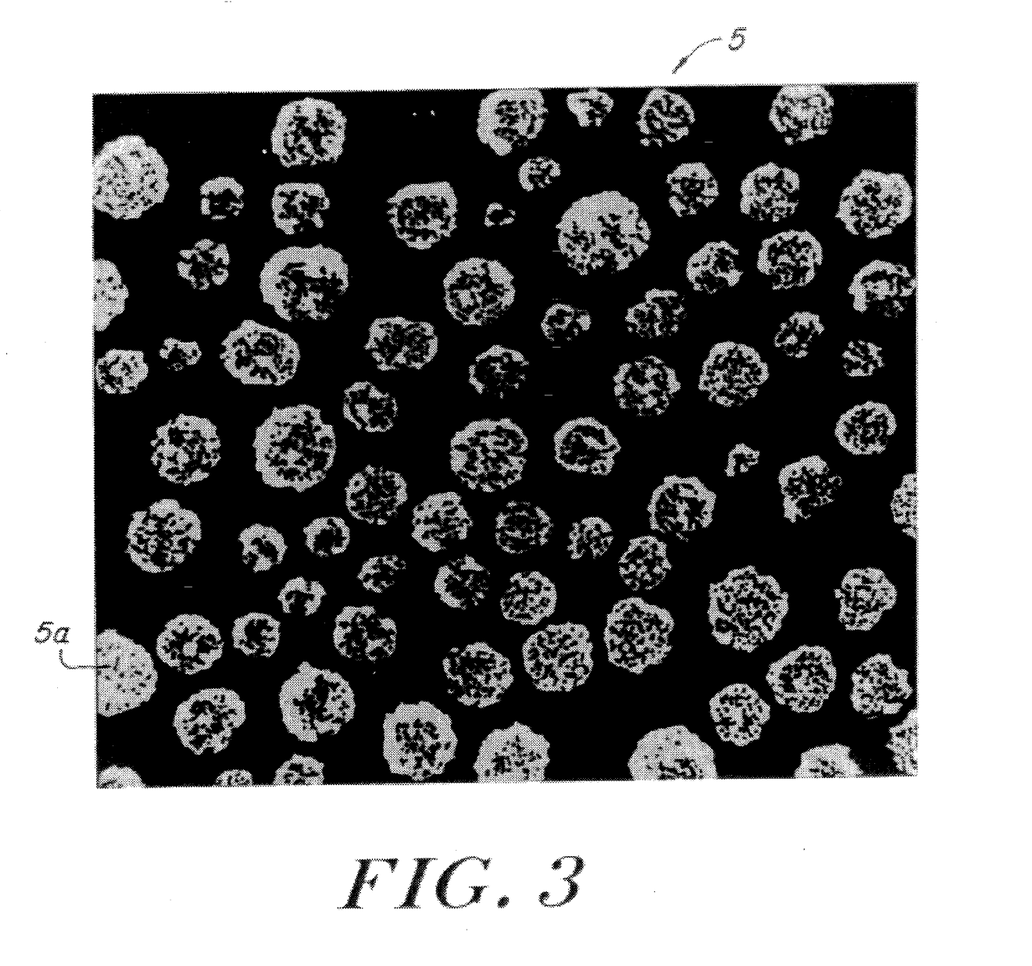
FIG. 3 provides a micrograph view of a fifty angstrom thick layer of a preferred silver/tin peritectic alloy employed as the preferred seed layer alloy in the present invention.

In FIG. (3) an SEM micrograph of a 50 A (i.e., fifty angstrom) thick layer of Ag—Sn is shown. The larger islands average around 700 A in diameter and the overall island configureation is characterized by very near or substantial homogeneity in island size. From an examination of AFM images of the same layer, with the Cr and CoCrPt and carbon deposited on top, it is apparent that the subsequent layers faithfully copy the morphology of the peritectic seed layer. When there is no peritectic seed layer it is believed that the aforesaid, unique degree of nearly uniform island sizing is not produced. This consequential homogeneity in island composition and size is thought to be the reason for the reduction in the magnetic anisotropy and modulation around the disc.

Figure 4:
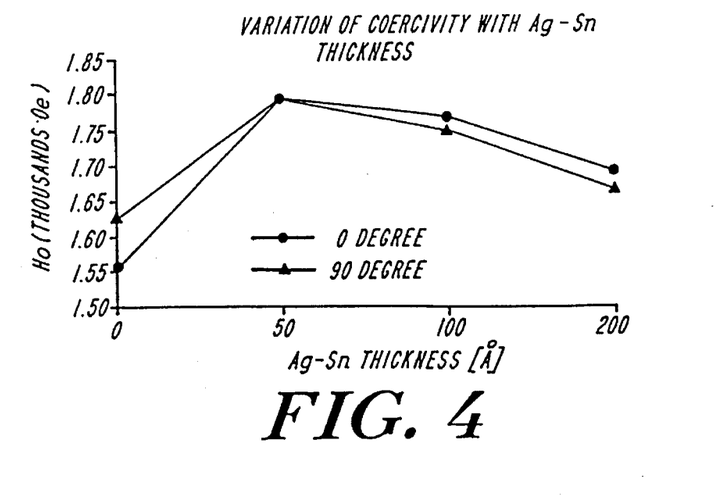
FIG. 4 provides a chart depicting variations in coercivity in relation to variations in thickness of the silver/tin peritectic alloy seed layer of the present invention and illustrating unique improvements obtained where the thickness of the seed layer lies generally in the fifty to one hundred angstrom range.
Figure 5:
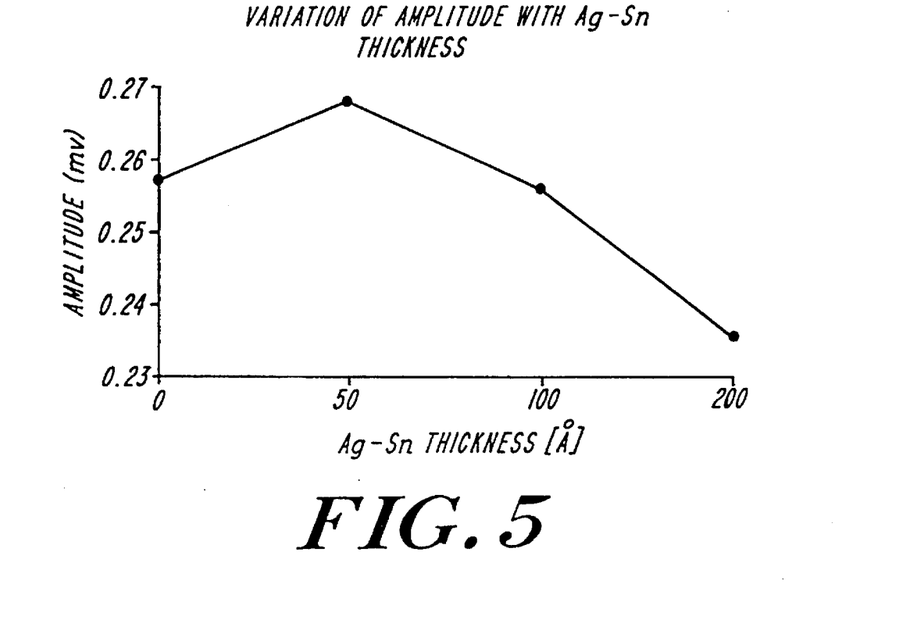
FIG. 5 provides a chart illustrating variations of amplitude in relation to variations in thickness of the seed layer of the present invention.
Figure 6:
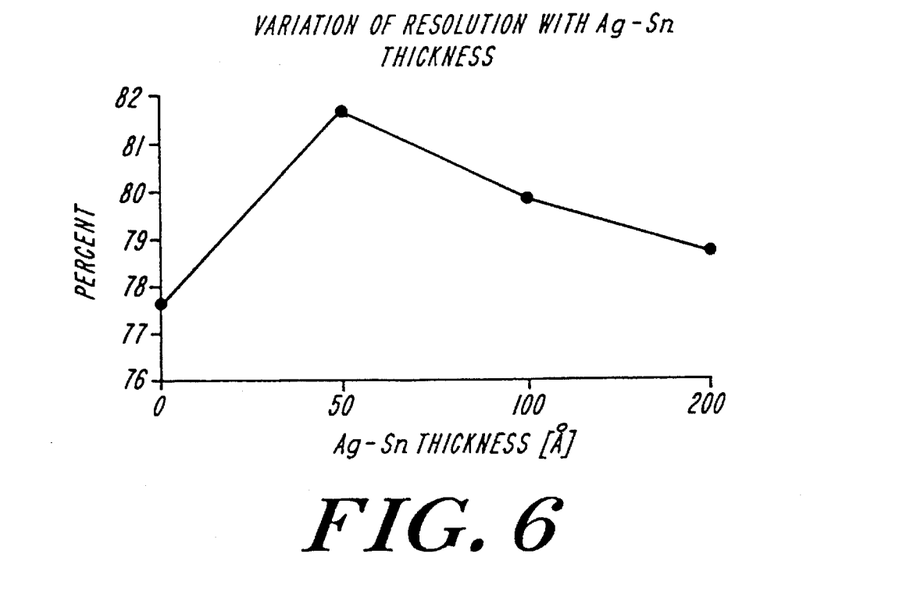
FIG. 6 provides a chart depicting variations in resolution in relation to variations in thickness of the peritectic silver/tin seed alloy of the present invention.
Figure 7:
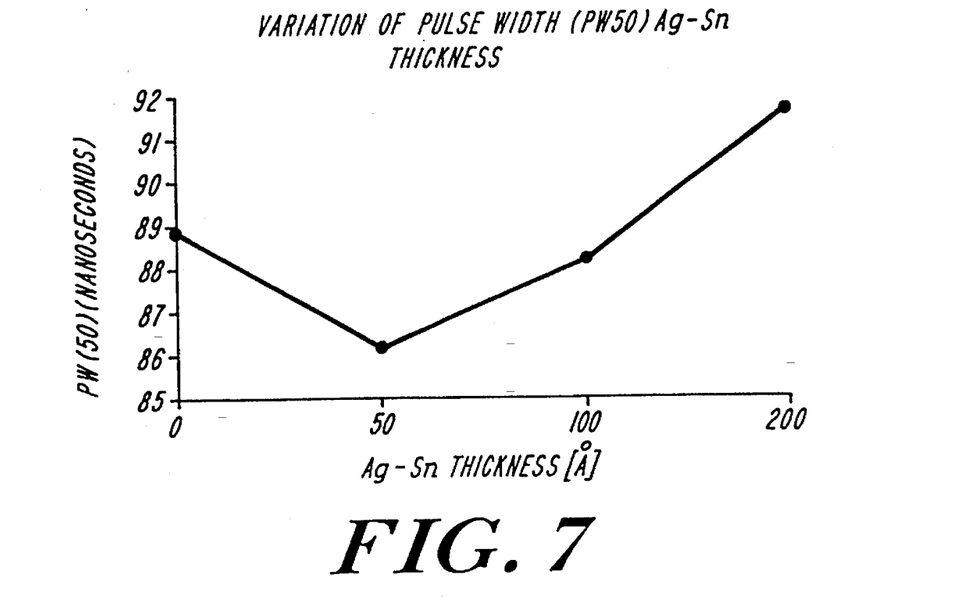
FIG. 7 provides a chart depicting variations in pulse width in relation to variations in thickness of the silver/tin peritectic seed layer alloy of the present invention.

In FIG. 4 the variation of coercivity in relation to the Ag—Sn thickness is shown. The coercivity value increases considerably with seed-layer thickness of up to 50 angstrom, after which it gradually decreases. What is interesting is that the zero (0) or travel direction and ninety (90) degree direction difference in the coercivity values virtually disappear at around 50 angstroms of Ag—Sn. Furthermore, there is also a minimum difference in the S* values (coercivity squareness) at that region.

From the x-ray diffraction scan patterns of Ag—Sn, AgSn/Cr/CoCrPt and Cr/CoCrPt, a definite difference in preferred orientation of the deposited films has ben observed, the most noticeable difference being in preferred orientation. It is apparent that the seed layer suppresses the perpendicular orientation of the magnetic layer (CoCrPt).

Figure 8:
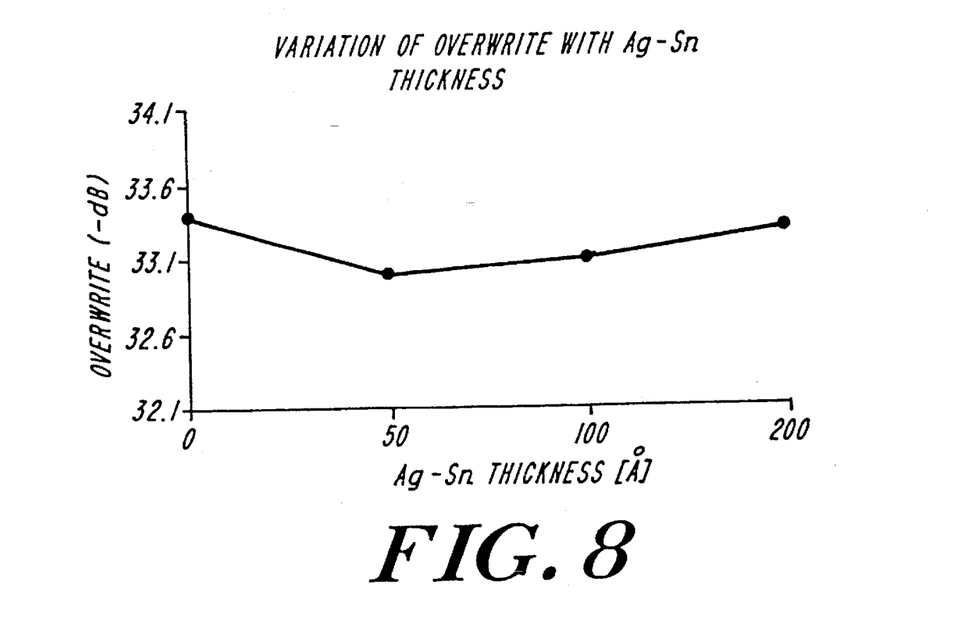
FIG. 8 provides an additional chart illustrating variations in overwrite in relation to the silver/tin thickness characteristics of the seed layer.
Figure 9:
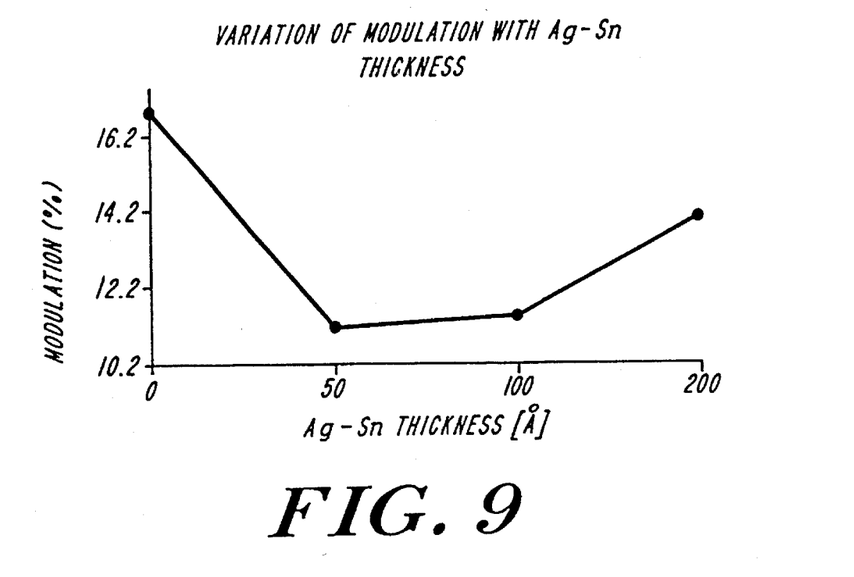
FIG. 9 provides a chart illustrating variations in modulation in relation to variations in thickness of the silver/tin peritectic seed layer.
Figure 10:
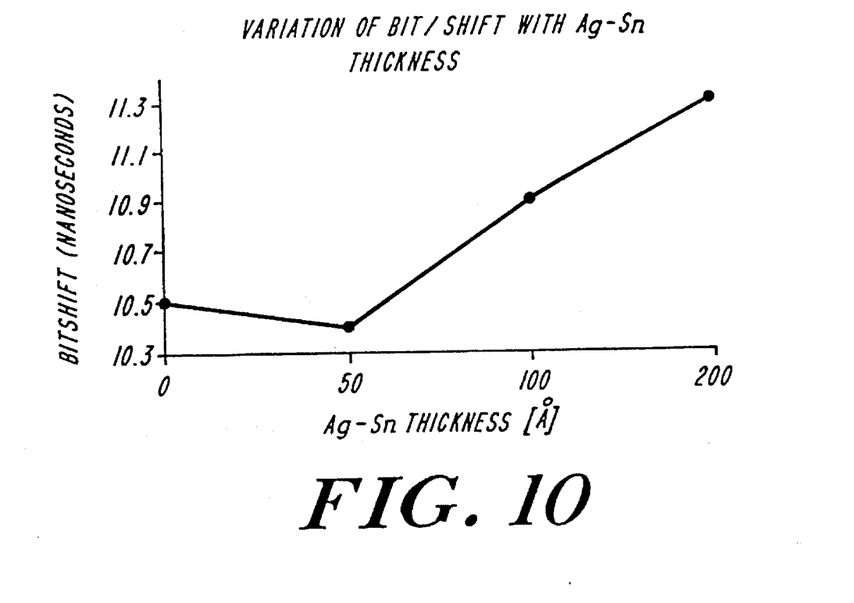
FIG. 10 illustrates variations of bit/shift in relation to variations in thickness of the silver/tin peritectic seed layer alloy.

FIGS. 5–10 depict the variations in some major read/write parametrics of a glass discs coated with increasing thicknesses of Ag—Sn. The slight decrease in over-write shown in FIG. 8 is attributed to the corresponding increase in the coercivity. In all the other cases there is a marked improvement shown within the read/write parametric value for seed layer thicknesses of around 50–100 A, after which coalescence of the seed-layer "bumps" or globules is thought to weaken grain segregation, this segregation being one of the causes of improvement in parametrics. As predicted by the increase in the orientation ratio, modulation also shows an improvement with increasing AgSn thickness, as evidenced by FIG. 9.

In the context of this discussion, this disclosure will now proceed to describe how a conventional, commercially available, state-of-the art sputter deposition system employing the unique peritectic alloy, seed layer forming, target means of the present invention is operable to produce the enhanced media of this invention.

Figure 1:
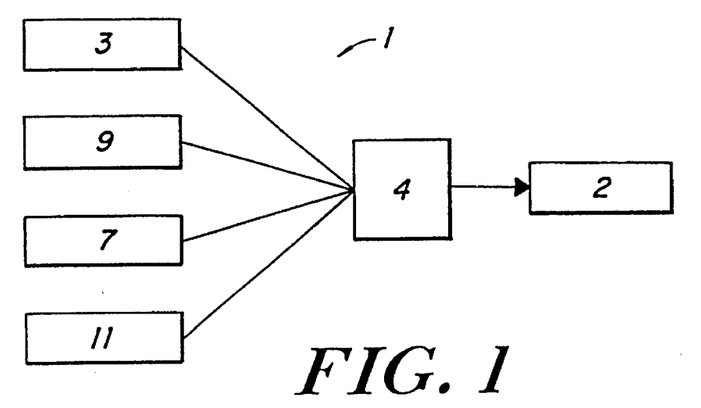
FIG. 1 provides a schematic illustration of apparatus elements of the invention.

As shown in FIG. 1, the apparatus 1 may comprise:

a sputter target 3 comprising an homogenous, peritectic alloy;

a sputter target 9 of chromium;

a sputter target 7 of cobalt, chromium and platinum (and possible other constituents);

a sputter target 11 of carbon; and an overall state-of-the art sputter deposition system 4 operable, in accordance with now well understood, thin film forming technology and procedures to sequentially, sputter deposit layers on a relatively non-wettable substrate means 6, such as glass.

Figure 2:
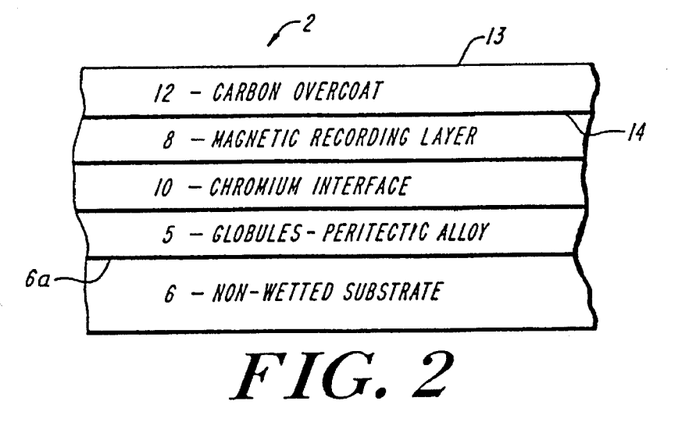
FIG. 2 provides a schematic illustration by the enhanced homogeneity of surface texturing and improved magnetics as achieved through the present invention.

This sequential sputtering is operable to produce the enhanced media 2 of this invention including, as shown in FIG. 2:

a relatively non-wettable base or substrate 6;

a sputter deposited seed layer 5 made up of dispersed, generally homogenous globules of a substantially peritectic alloy;

a conventional, sputter deposited chromium layer 10 underlying a magnetic recording layer;

a sputter deposited magnetic recording layer comprising an alloy such as cobalt-chromium-platinum of the type known in the art; and a protective overcoat 12 comprising surface lubricated sputter deposited carbon.

As will be understood, modern thin film disk manufacture normally involves sputter deposition of the aforesaid sputtered layers on each of opposite sides of a disk substrate.

However, for purposes of this discussion, the formation of thin film means on only one side of the substrate means or disk base will be discussed.

Apparatus Aspects

The apparatus 1 for enhancing the magnetic and textured properties of thin film magnetic recording media 2, according to this invention comprises comercially available, thin film forming, sputter deposition apparatus including:

sputter target means 3 for providing a sputtering target comprising a substantially homogenous and peritectic alloy;

overall sputter system means 4 for forming a seed layer 5, comprising substantially uniformly sized but mutually dispersed globules 5a (FIG. 2) of a substantially homogenous and peritectic alloy on a relatively non-wettable substrate, by sputter deposition from the substantially homogenous target 3;

sputter target means 7 for sputter coating a magnetic recording layer 8 over the substantially uniformly sized globules of the substantially peritectic alloy seed layer 5; and overall system 4 utilizing peritectic alloy target means 3 for substantially maintaining the homogeneity of the seed alloy in its sputtering transition from the sputtering target 3 to said substrate 6 and while the magnetic recording layer 8 is formed;

The presence of the substantially homogenous and peritectic seed layer 5 is operable to provide substantially uniform sizing of the dispersed globules 5a (see FIG. 3) of peritectic alloy, to induce a substantially uniform surface roughness at each of faces 13 and 14 (FIG. 2) for the sputter coated magnetic recording layer 8, to substantially orient the crystal orientation of the magnetic recording layer 8 such that the axis of easy magnetization (o) generally lies in the film plane of the media, and to substantially reduce magnetic variation in the film plane of the magnetic, recording layer.

Preferably, the system means 4 serves to control the thickness of the peritectic seed layer 5 so as to cause this thickness to be formed within a range of about fifty (50) to one hundred (100) angstroms, with this seed layer thickness being operable to substantially minimize modulation properties of the magnetic recording layer 8, and to substantially, nearly equalize coercivity of the magnetic recording layer 8 as measured tangentially (0) along the recording track and as measured orthogonally (90) of this tangential measurement.

In the presently preferred embodiment, and in the apparatus as described above for enhancing the properties of thin film magnetic media:

the substantially peritectic alloy comprises
about seventy five (75) percent, by weight, silver and about twenty five (25) percent, by weight, tin;

the substantially peritectic alloy has a melting point as low as about four hundred eighty degrees centigrade (480° C.);

the apparatus 1 includes sputter deposition target means 9 for forming a layer 10 of chromium by sputter deposition upon the seed layer 5; and the target means 7 for sputter coating the magnetic recording data layer, comprising cobalt, chromium, and platinum, and possibly additional elements, is operable to sputter deposit the magnetic recording layer 8 upon the chromium layer 10;

The apparatus includes further sputter deposition, carbon target means 11 for forming a wear resistant layer 12 comprising sputter deposited carbon over the magnetic layer 8 comprising cobalt, chromium, and platinum.

The target and system means 4 and 7 for forming a seed layer 5, comprising a substantially peritectic alloy, are operable to deposit this peritectic alloy as generally mutually spaced globules generally uniformly dispersed across an alloy receiving surface of the substrate 6, with the surface texturing 13, 14 of the media 2 substantially mirroring the dispersion of globules 5a on the substrate 6 and providing a generally uniform surface roughness on the exposed media exterior surface 13.

Method Aspects

The appropriately controlled operation of apparatus 4 is such as to produce the method of this invention for enhancing the magnetic and textured properties of thin film magnetic recording media. This method is characterized by:

providing the sputtering target 3 comprising a substantially homogenous and peritectic alloy;

forming the seed layer 5, comprising substantially uniformly sized but mutually dispersed globules 5a of a substantially homogenous and peritectic alloy, on the substrate 6 by sputter deposition from the substantially homogenous peritectic alloy target 3;

sputter coating the magnetic recording layer 8 over the substantially uniformly sized globules 5a of the substantially peritectic alloy seed layer 5; and substantially maintaining the homogeneity of the alloy in its sputtering transition from the sputtering target 3 to the substrate 6 and while the magnetic recording layer 8 is formed, this being achieved due to the peritectic qualities of the target 3.

The presence of the substantially homogenous and peritectic seed layer 5 is operable to provide the substantially uniform sizing of the dispersed globules 5a of peritectic alloy, to induce a substantially uniform surface roughness 13 for the sputter coated magnetic recording layer 8, to substantially orient the crystal orientation of the magnetic recording layer 8 such that the axis (0) of easy magnetization generally lies in the film plane of the media, and to substantially reduce magnetic variation in the film plane of the magnetic, recording layer 8.

Preferably, the thickness of the peritectic seed layer 5 is formed within a range of about fifty (50) to one hundred (100) angstroms. This seed layer thickness is operable to substantially minimize modulation properties of the magnetic recording layer 8, and to substantially, nearly equalize coercivity of the magnetic recording layer as measured tangentially (o) along the recording track and as measured orthogonally (90) of this tangential measurement.

In an optimized format, this method is further characterized in that:

the substantially peritectic alloy comprises
about seventy five (75) percent, by weight, silver and about twenty five (25) percent by weight, tin;

the substantially peritectic alloy has a melting point as low as about four hundred eighty degrees centigrade (480° C.);

a layer 10 of chromium is formed by sputter deposition upon the seed layer 5;

the magnetic recording layer 8, comprising cobalt, chromium, and platinum, is sputter deposited upon the chromium 10 layer; and a wear resistant layer 12 comprising sputter deposited carbon is formed over the layer 8 comprising cobalt, chromium, and platinum (this textured layer requiring a subsequent application of one of now well known, thin film media lubricant materials).

The substantially peritectic alloy is deposited as generally mutually spaced globules 5a generally uniformly dispersed across the alloy receiving surface 6a of the substrate 6, with the surface texturing 13, 14 of the media 2 substantially mirroring the dispersion of the globules 5a on substrate 6 and providing a generally uniform surface roughness.

Improved Media Aspects

Thin film magnetic recording media of this invention, having enhanced magnetic and textured properties, is characterized by the combination of:

substrate means 6;

a seed layer 5, comprising substantially uniformly sized but mutually dispersed globules 5a of a substantially homogenous and peritectic alloy, formed on the substrate means 6 by sputter deposition from a substantially homogenous target 3; and a magnetic recording layer 8 sputter coated over the substantially uniformly sized globules 5a of the substantially peritectic alloy seed layer 5, while substantially maintaining the homogeneity of the substantially peritectic alloy.

The presence of the substantially homogenous and peritectic seed layer is operable to provide the substantially uniform sizing of the dispersed globules 5a of peritectic alloy, to induce a substantially uniform surface roughness 13, 14 for the sputter coated magnetic recording layer, to substantially orient the crystal orientation of said magnetic recording layer 8 such that the axis of easy magnetization (0) generally lies in the film plane of the media, and to substantially reduce the magnetic variation in the film plane of the magnetic, recording layer 6.

Preferably, the thickness of the seed layer 5 is formed within a range of about fifty (50) to one hundred (100) angstroms, with said this layer thickness being operable to substantially minimize modulation properties of the magnetic recording layer 8, and to substantially, nearly equalize coercivity of the magnetic recording layer 8 as measured tangentially (0) along the recording track and as measured orthogonally (90) of the tangential measurement.

Thin film magnetic recording media as described above, is particularly optimized where:

the substantially peritectic alloy comprises
about seventy five (75) percent, by weight, silver and about twenty five (25) percent, by weight, tin;

the substantially peritectic alloy has a melting point as low as about four hundred eighty degrees centigrade (480° C.);

a layer 10 of chromium is formed by sputter deposition upon the seed layer 5;

the magnetic recording layer 8, comprising cobalt, chromium, and platinum, is sputter deposited upon the chromium layer 10; and a wear resistant layer 12 comprising sputter deposited carbon is formed over the recording layer 8 comprising cobalt, chromium, and platinum.

The substantially peritectic alloy is deposited as generally mutually spaced, globules 5a dispersed across an alloy receiving surface 6a of the substrate means 6, with the surface texturing 13, 14, of the media 2 substantially mirroring the surface dispersion of globules 5a on the substrate surface 6a and providing a generally uniform surface roughness.

This uniform roughness facilities uniform retention and thickness of the requisite lubricant layer applied to the carbon overcoat. Moreover, it enhances the operability of the media in avoiding the formation of erratically sized "peaks and valleys" on the outer media surface 13.

SUMMARY OF ADVANTAGES, NON-OBVIOUSNESS, AND SCOPE OF THE INVENTION

Those skilled in the thin film media art and familiar with this disclosure will recognize that the prior art discussed at the outset of this report is in no way suggestive of the unique utilization of the substantially peritectic seed alloy concept of the present invention or of the beneficial results in more uniform or homogenous surface texturing and improved magnetic properties resulting from the utilization of this specific and esoteric seed layer material.

while those familiar with this disclosure and skilled in the art may recognize additions, deletions, substitutions, modifications, or other variations in the invention as heretofore set forth, it is to be appreciated that the scope of the invention is intended to be embracive of such variations which could be extrapolated or realized from the present disclosure, all of which are deemed to fall within the purview of the impended claims.

What is claimed is:

1. Thin film magnetic recording media having enhanced magnetic and textured properties, said media comprising:

a substrate;

a seed layer, comprising substantially uniformly sized but mutually dispersed globules of a substantially homogenous and peritectic alloy formed on said substrate by sputter deposition from a substantially homogenous target, comprising a substantially homogenous and peritectic alloy;

a magnetic recording layer sputter coated over said substantially uniformly sized globules of said substantially peritectic alloy seed layer, while substantially maintaining the homogeneity of said peritectic alloy in its sputtering transition from said sputtering target to said substrate and while said magnetic recording layer is formed;

the presence of said substantially homogenous and peritectic seed layer providing said substantially uniform sizing of said dispersed globules of peritectic alloy, inducing a substantially uniform surface roughness for said sputter coated magnetic recording layer, orienting the crystal orientation of said magnetic recording layer such that the axis of easy magnetization generally lies in the film plane of said media, and substantially reducing the magnetic variation in the film plane of said magnetic, recording layer; and the thickness of said seed layer being formed within a range of about fifty (50) to one hundred (100) angstroms, with said seed layer thickness substantially minimizing modulation properties of said magnetic recording layer, and substantially, nearly equalizing coercivity of said magnetic recording layer as measured tangentially along the recording trace and as measured orthogonally of said tangential measurement; and said media having substantially uniform sizing of said globules obtained in response to the peritectic character of said peritectic alloy forming said seed layer, and said substantial maintenance of homogeneity of said peritectic alloy;

said peritectic alloy comprising about seventy five (75) percent, by weight, silver and about twenty five (25) percent by weight tin;

the homogeneity of said peritectic alloy globules resulting, during equilibrium solidification of said peritectic alloy globules on said substrate, from reaction of solid and liquid components of said alloy prior solidification of said globules, to form a single, homogenous, peritectic alloy; and said dispersed globules of peritectic alloy being substantially free of reaction with said magnetic recording layer and manifesting a generally uniform, globular configuration array underlying said magnetic recording layer.

2. Thin film magnetic recording media having enhanced magnetic and textured properties, said media comprising:

a substrate;

a seed layer, comprising a substantially homogenous and peritectic alloy formed on said substrate, by sputter deposition from a substantially homogenous target, comprising a substantially homogenous and peritectic alloy;

a magnetic recording layer sputter coated over said substantially peritectic alloy seed layer, while substantially maintaining the homogeneity of said peritectic alloy in its sputtering transition from said sputtering target to said substrate and while said magnetic recording layer is formed;

the presence of said substantially homogenous and peritectic seed layer substantially orienting the crystal orientation of said magnetic recording layer such that the axis of easy magnetization generally lies in the film plane of said media, and substantially reducing the magnetic variation in the film plane of said magnetic, recording layer; and the thickness of said layer being controlled so as to substantially minimize modulation properties of said magnetic recording layer, and substantially, nearly equalize coercivity of said magnetic recording layer as measured tangentially along the recording trace and as measured orthogonally of said tangential measurement; and said media having substantially uniform sizing of said globules obtained in response to the peritectic character of said peritectic alloy forming said seed layer, and said substantial maintenance of homogeneity of said peritectic alloy;

said peritectic alloy comprising about seventy five (75) percent, by weight, silver and about twenty five (25) percent by weight tin;

the homogeneity of said peritectic alloy globules resulting, during equilibrium solidification of said peritectic alloy globules on said substrate, from reaction of solid and liquid components of said alloy prior solidification of said globules, to form a single, homogenous, peritectic alloy; and said dispersed globules of peritectic alloy being substantially free of reaction with said magnetic recording layer and manifesting a generally uniform, globular configuration array underlying said magnetic recording layer.

3. Thin film magnetic recording media having enhanced magnetic and textured properties, said media comprising:

a substrate;

a seed layer, comprising substantially uniformly sized but mutually dispersed globules of a substantially homogenous and peritectic alloy formed on said substrate by sputter deposition from a substantially homogenous target comprising a substantially homogenous and peritectic alloy;

a magnetic recording layer sputter coated over said substantially uniformly sized globules of said substantially peritectic alloy seed layer, while substantially maintaining the homogeneity of said peritectic alloy in its sputtering transition from said sputtering target to said substrate and while said magnetic recording layer is formed;

the presence of said substantially homogenous and peritectic seed layer providing said substantially uniform sizing of said dispersed globules of peritectic alloy, and consequently inducing a substantially uniform surface roughness for said sputter coated magnetic recording layer; and said media having substantially uniform sizing of said globules obtained in response to the peritectic character of said peritectic alloy forming said seed layer, and said substantially maintenance of homogeneity of said peritectic alloy;

said peritectic alloy comprising about seventy five (75) percent, by weight, silver and about twenty five (25) percent weight by tin;

the homogeneity of said peritectic alloy globules resulting during equilibrium solidification of said peritectic alloy globules on said substrate, from reaction of solid and liquid components of said alloy prior solidification of said globules, to form a single, homogenous, peritectic alloy; and said dispersed globules of peritectic alloy being substantially free of reaction with said magnetic recording layer and manifesting a generally uniform, globular configuration array underlying said magnetic recording layer.

4. Thin film magnetic media as described in any one of claims 1, 2, or 3 having enhanced magnetic and textured properties wherein:

said substantially peritectic alloy comprises about seventy five (75) percent, by weight, silver and about twenty five (25) percent by weight, tin;

said substantially peritectic alloy has a melting point of about four hundred eighty degrees centigrade (480° C.);

a layer of chromium is formed by sputter deposition upon said seed layer;

said magnetic recording layer, comprising cobalt, chromium, and platinum, is sputter deposited upon said chromium layer;

a wear resistant layer comprising sputter deposited carbon is formed over said layer comprising cobalt, chromium, and platinum; and said substantially peritectic alloy is deposited as generally mutually spaced globules generally uniformly dispersed across an alloy receiving surface of said substrate, with the surface texturing of said media substantially mirroring the dispersion of said globules on said substrate and providing a generally uniform surface roughness.

* * * * *